US012690149B2

(12) United States Patent 
Li

(10) Patent No.: US 12,690,149 B2 
(45) Date of Patent: Jul. 21, 2026

(54) CARD HOLDER APPARATUS AND ELECTRONIC DEVICE

(71) Applicant: VIVO MOBILE COMMUNICATION CO., LTD., Chang'an (CN)

(72) Inventor: Manlin Li, Chang'an (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 512 days.

(21) Appl. No.: 18/335,638

(22) Filed: Jun. 15, 2023

(65) Prior Publication Data

US 2023/0354537 A1 Nov. 2, 2023

Related U.S. Application Data

(63) Continuation of application No. PCT/CN2021/137351, filed on Dec. 13, 2021.

(30) Foreign Application Priority Data

Dec. 15, 2020 (CN) .......................... 202011473680.0

(51) Int. Cl.
   *H01R 13/633* (2006.01)
   *H05K 5/02* (2006.01)
(52) U.S. Cl.
   CPC ......... *H05K 5/0295* (2013.01); *H01R 13/633* (2013.01)
(58) Field of Classification Search
   None
   See application file for complete search history.

(56) References Cited

U.S. PATENT DOCUMENTS 8,337,223 B2 * 12/2012 Gao ..................... G06K 7/0069
                                               439/159
8,913,396 B2 * 12/2014 Chao ..................... H04M 1/026
                                               361/727

(Continued)

FOREIGN PATENT DOCUMENTS

CN        103715574 A      4/2014
CN        210866560 U      6/2020

(Continued)

OTHER PUBLICATIONS

International Search Report and Written Opinion related to Application No. PCT/CN2021/137351; reported on Mar. 1, 2022.

(Continued)

*Primary Examiner* — Felix O Figueroa

(57) ABSTRACT

Disclosed are a card tray and card holder apparatus and an electronic device. The card tray and card holder apparatus includes a card pressing cover, a detection and ejection mechanism, a circuit board, a card tray, and a card holder. The card pressing cover is fastened to the circuit board, a first accommodating space is formed by the card pressing cover and the circuit board, and the card tray and the card holder are both disposed in the first accommodating space. The card tray includes a detection matching portion and a lever matching portion. The detection and ejection mechanism is disposed on the card pressing cover and includes a lever and a detection portion, where the lever is rotatably disposed on the card pressing cover, the detection portion is disposed on the card pressing cover.

16 Claims, 13 Drawing Sheets

(56) References Cited

U.S. PATENT DOCUMENTS

| | | | | |
|---|---|---|---|---|
| 8,947,885 | B2 * | 2/2015 | Wu | H04B 1/3816 |
| | | | | 361/679.31 |
| 9,264,087 | B2 * | 2/2016 | Lin | H05K 7/10 |
| 9,378,436 | B2 * | 6/2016 | Wang | G06K 13/08 |
| 9,445,521 | B2 * | 9/2016 | Tan | H04M 1/026 |
| 9,680,243 | B2 * | 6/2017 | Shimotsu | H01R 13/633 |
| 9,755,338 | B2 * | 9/2017 | Ning | H01R 12/718 |
| 9,787,007 | B2 * | 10/2017 | Wang | H01R 13/635 |
| 10,909,430 | B2 * | 2/2021 | Zhao | G06K 7/0056 |
| 2013/0196523 | A1 | 8/2013 | Lim et al. | |
| 2019/0272453 | A1 | 9/2019 | Argyres et al. | |
| 2021/0289647 | A1 | 9/2021 | Li | |

FOREIGN PATENT DOCUMENTS

| | | | |
|---|---|---|---|
| CN | 111416242 | A | 7/2020 |
| CN | 112688101 | A | 4/2021 |
| JP | 2019153573 | A | 9/2019 |
| WO | 2020114209 | A1 | 6/2020 |

OTHER PUBLICATIONS

Japanese Office Action related to Application No. 2023-536139; reported on Jun. 3, 2024.

* cited by examiner

CARD HOLDER APPARATUS AND ELECTRONIC DEVICE

CROSS-REFERENCE TO RELATED APPLICATIONS

The present application is a continuation application of PCT International Application No. PCT/CN2021/137351 filed on Dec. 13, 2021, which claims priority to Chinese Patent Application No. 202011473680.0, filed with the China National Intellectual Property Administration on Dec. 15, 2020 and entitled "CARD HOLDER APPARATUS AND ELECTRONIC DEVICE", which is incorporated herein by reference in its entirety.

TECHNICAL FIELD

This application relates to the field of communications technologies, and in particular, to a card holder apparatus and an electronic device.

BACKGROUND

Growing user demand has been driving constant performance optimization of electronic devices. As known to all, an electronic device generally comes with a card tray for holding a smart card (for example, a SIM card or a T card). The smart card can be loaded to or removed from the electronic device by installing or removing the card tray.

The electronic device in the related art is provided with an ejection mechanism and a detection mechanism. The detection mechanism can detect states (an installed state and a removed state) of the card tray, and the ejection mechanism ejects the card tray out so that the card tray is removed subsequently. However, at present, the ejection mechanism and the detection mechanism are located by the side of the card tray and occupy a large on-board space of a circuit board. This leads to a low on-board space utilization of the circuit board, thereby hindering further integration of the electronic device.

SUMMARY

According to a first aspect, an embodiment of this application discloses a card tray and card holder apparatus. The apparatus is applied to an electronic device, and includes a card pressing cover, a detection and ejection mechanism, a circuit board, a card tray, and a card holder, where:

the card pressing cover is fastened to the circuit board, a first accommodating space is formed by the card pressing cover and the circuit board, and the card tray and the card holder are both disposed in the first accommodating space;

the card tray includes a detection matching portion and a lever matching portion;

the detection and ejection mechanism is disposed on the card pressing cover and includes a lever and a detection portion, where the lever is rotatably disposed on the card pressing cover, the detection portion is disposed on the card pressing cover, a first end portion of the lever is disposed opposite an ejector pin hole of the electronic device, and a second end portion of the lever is disposed opposite the lever matching portion, where the second end portion of the lever is able to rotate with the lever in a first direction and comes in contact with the lever matching portion, so as to drive at least part of the card tray to move out of the first accommodating space; and the detection portion cooperates with the detection matching portion, and the detection portion is configured to detect a card tray state, where the card tray state includes an installed state and a removed state.

According to a second aspect, an embodiment of this application discloses an electronic device, including the card tray and card holder apparatus provided in the first aspect.

BRIEF DESCRIPTION OF DRAWINGS

To describe the technical solution in the embodiments of this application or BACKGROUND more clearly, the following briefly describes the accompanying drawings required for describing the embodiments or the background. Apparently, a person of ordinary skill in the art may still derive other drawings from these accompanying drawings without creative efforts.

REFERENCE SIGNS

Figure 1:
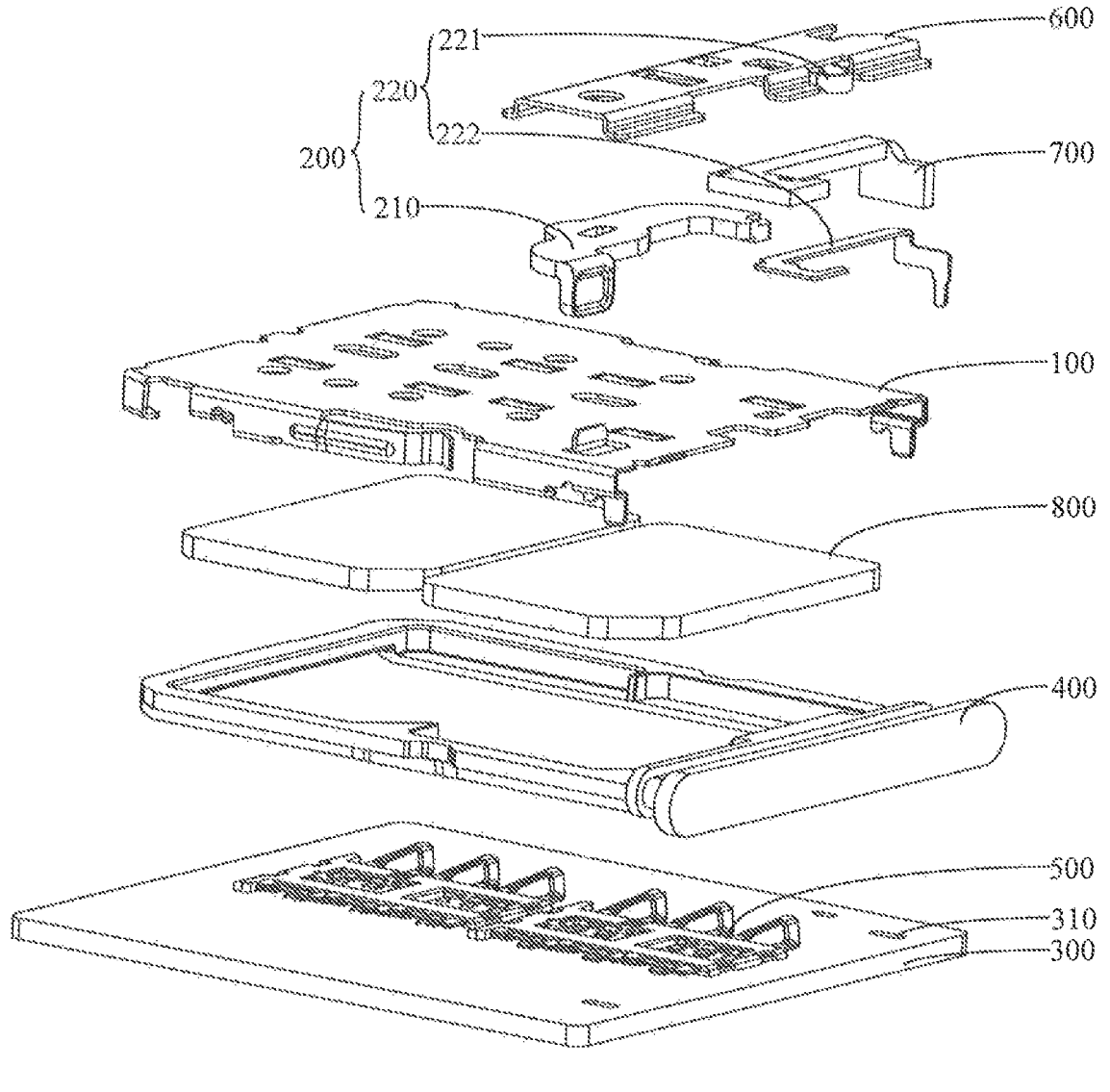
FIG. 1 is a schematic exploded view of a card tray and card holder apparatus according to an embodiment of this application.
Figure 2:
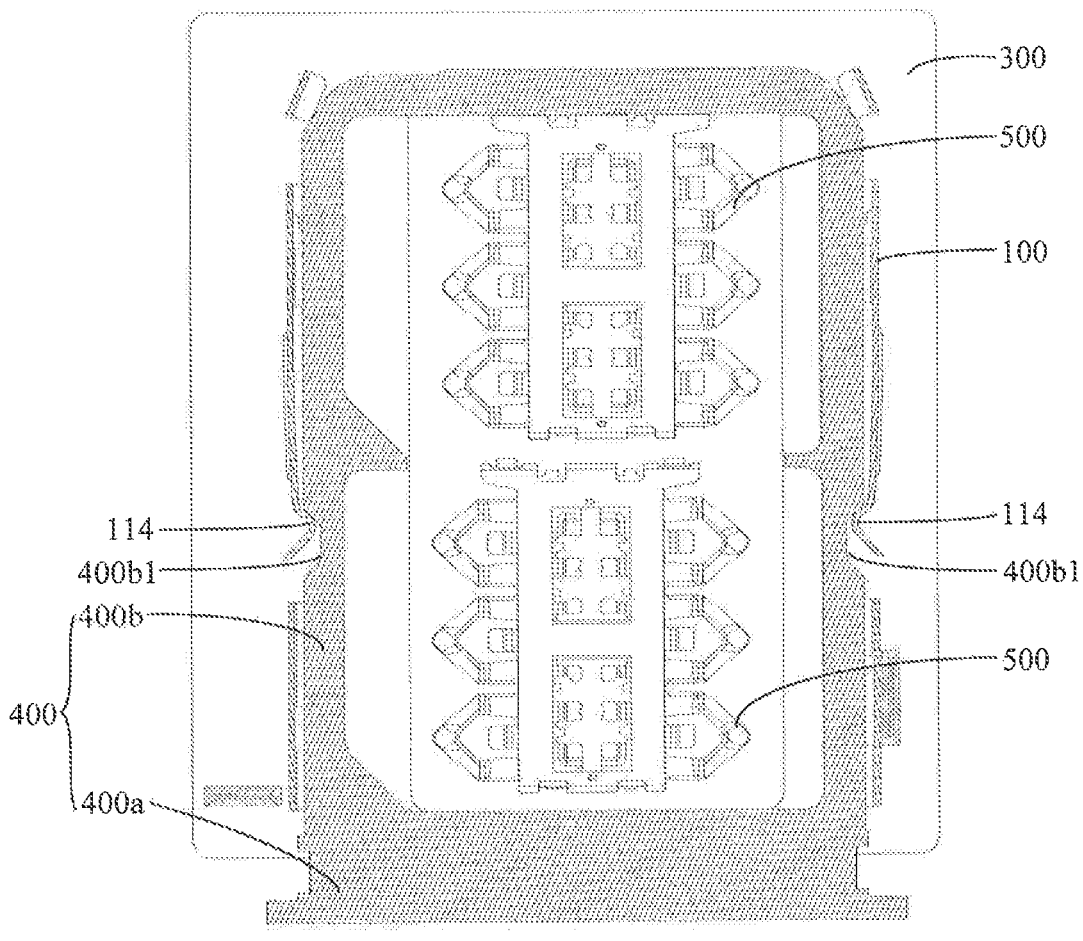
FIG. 2 is a schematic diagram of a card tray and card holder apparatus according to an embodiment of this application, with the card tray in an installed state and some structures shown in a sectional view.
Figures 3, 4:
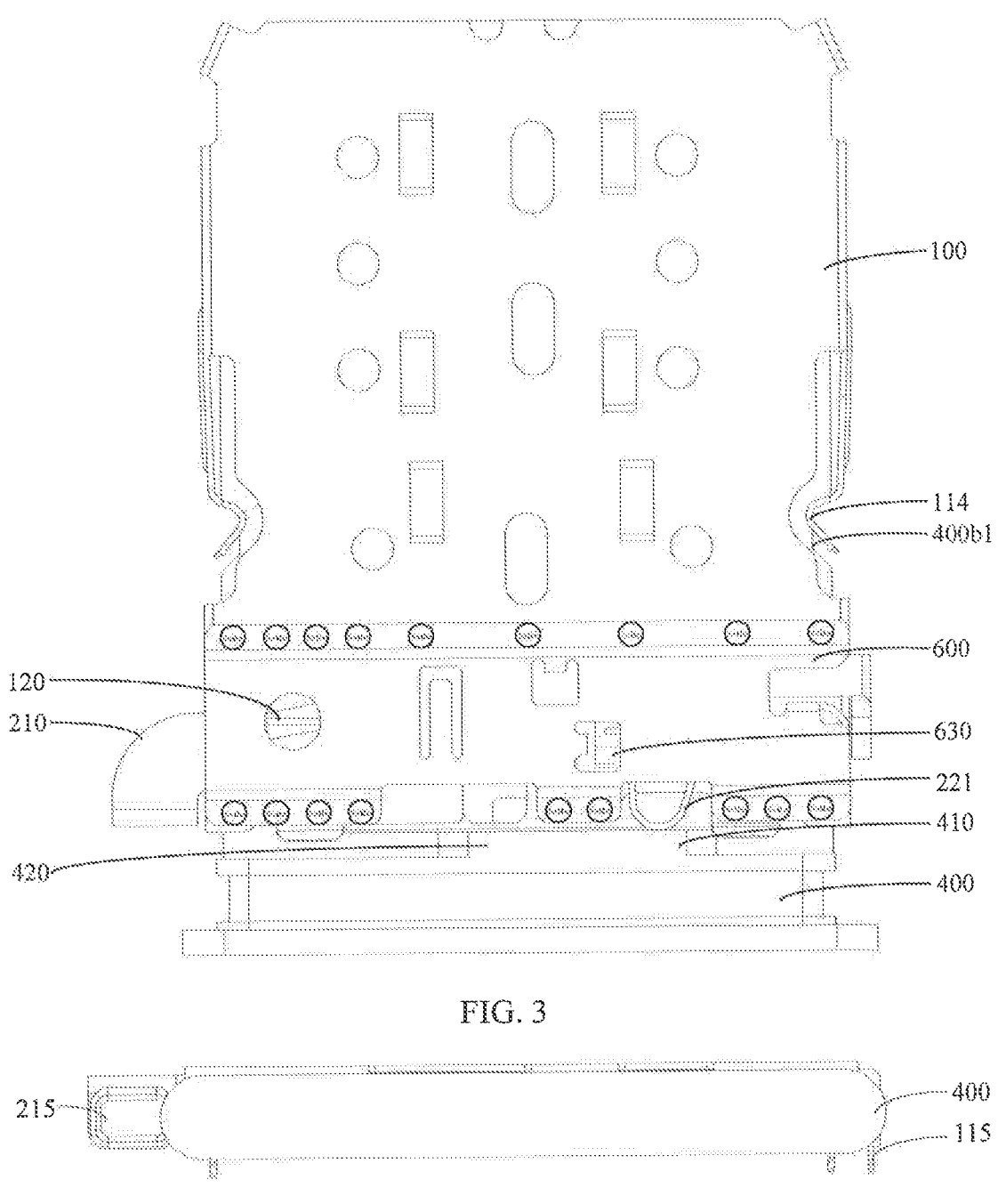
FIG. 3 is a schematic diagram of some structures of a card tray and card holder apparatus according to an embodiment of this application, with the card tray in an installed state.
FIG. 4 is a bottom view of FIG. 3.
Figure 5:
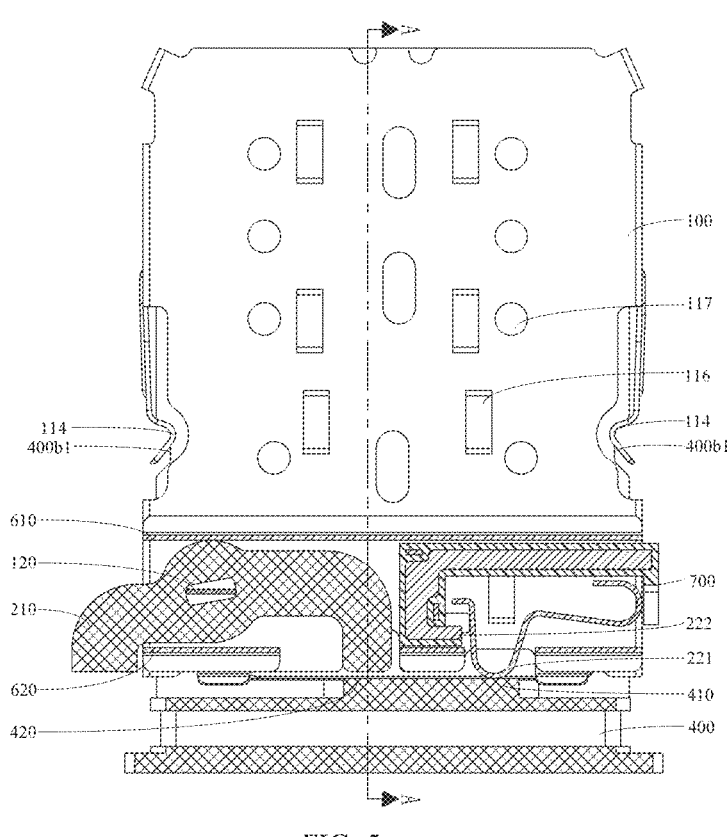
FIG. 5 is a schematic diagram of a card tray and card holder apparatus according to an embodiment of this application, with the card tray in an installed state and some structures shown in a sectional view.
Figure 6:
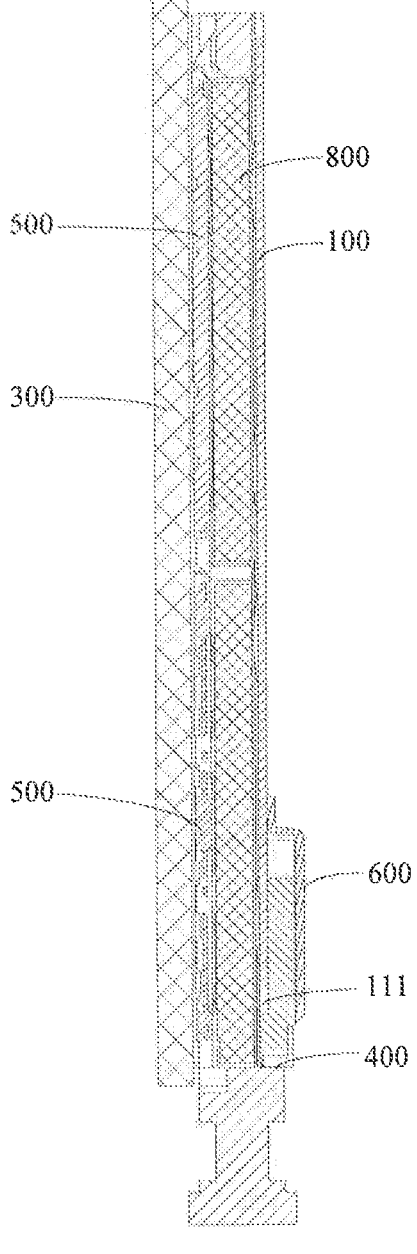
FIG. 6 is a cross-sectional view of FIG. 5 in the A-A direction.
Figure 7:
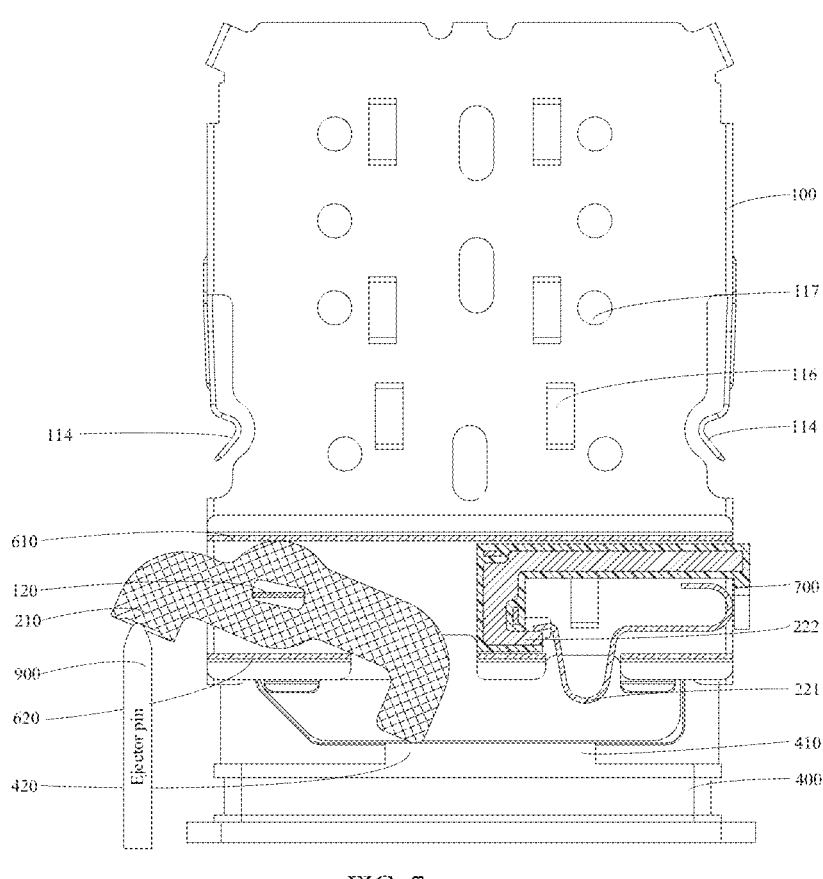
FIG. 7 is a schematic diagram of a card tray and card holder apparatus according to an embodiment of this application, with the card tray in a removed state and some structures shown in a sectional view.
Figure 8:
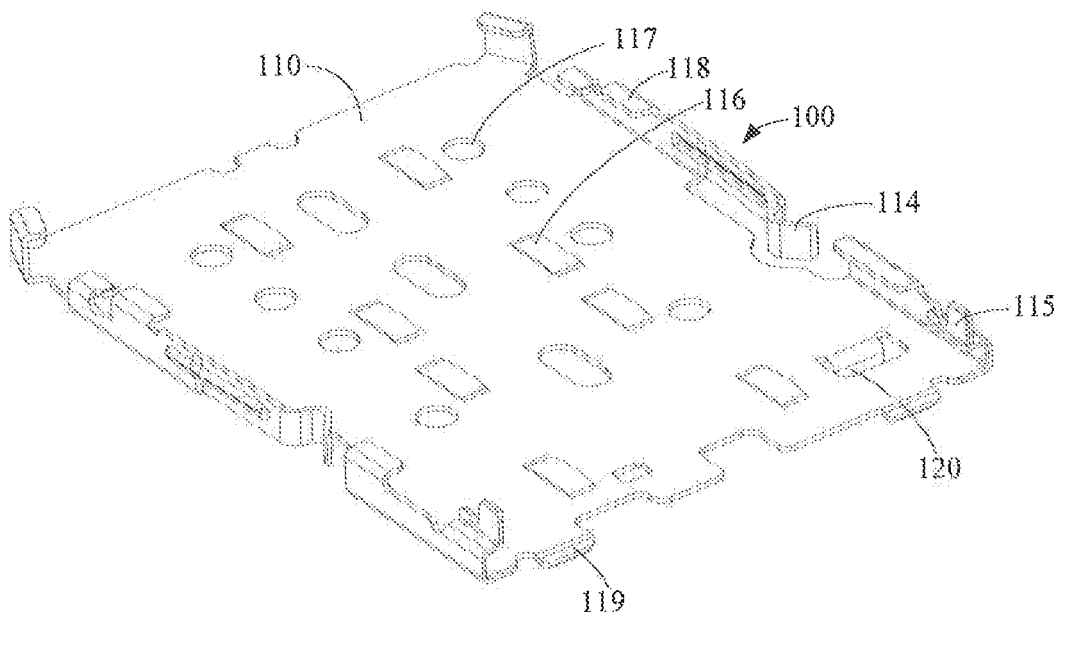
FIG. 8 is a three-dimensional schematic structural diagram of a card pressing cover according to an embodiment of this application.
Figure 9:
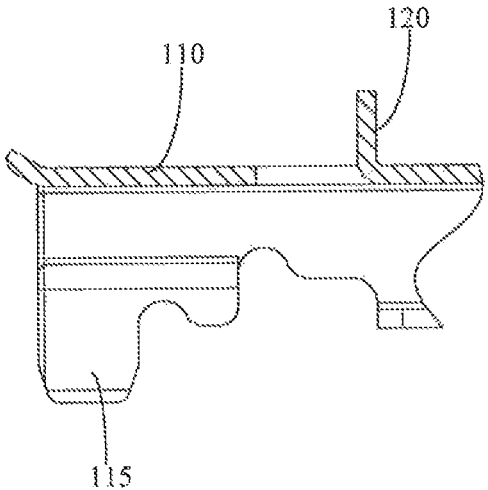
FIG. 9 to FIG. 11 each are a cross-sectional view of partial structure of a card pressing cover of a different structure.

100: card pressing cover,
110: cover body, 111: first escape opening, 112: anti-dust hole, 113: second escape opening, 114: clasping spring arm, 115: plug positioning portion, 116: elastic bending and pressing portion, 117: second observation hole, 118: welding fillet, 119: guiding bent portion, 120: connecting shaft;
200: detection and ejection mechanism,
210: lever, 211: rotation matching hole, 212: curved flange, 213: first thickening portion, 214: sheet-shaped main body, 215: sheet-shaped bending portion, 2151: limiting recess;
220: detection portion, 221: detection spring piece, 2211: second thickening portion, 222: detection terminal,
300: circuit board, 310: positioning hole,
400: card tray, 410: detection matching portion, 420: lever matching portion, 400*a*: card tray cap, 400*b*: card tray body, 400*b*1: positioning notch, 400*c*: bar-shaped boss,
500: card holder,
600: protective cover, 610: inner supporting side wall, 620: outer supporting side wall, 630: first observation hole, 640: first positioning flange, 650: second positioning flange,
700: insulation portion,
800: smart card, and
900: ejector pin.

Description of Embodiments

To make the objectives, technical solutions, and advantages of this application clearer, the following clearly describes the technical solutions of this application with reference to specific embodiments of this application and corresponding drawings. Apparently, the described embodiments are merely some rather than all the embodiments of this application. All other embodiments obtained by a person of ordinary skill in the art based on the embodiments of this application without creative efforts fall within the protection scope of this application.

The technical solutions disclosed in the embodiments of this application are described in detail below with reference to the accompanying drawings.

Refer to FIG. 1 to FIG. 20. The embodiments of this application disclose a card tray and card holder apparatus. The card tray and card holder apparatus disclosed is applied to an electronic device.

The card tray and card holder apparatus according to the embodiments of this application includes a card pressing cover 100, a detection and ejection mechanism 200, a circuit board 300, a card tray 400, and a card holder 500.

The electronic device typically includes a housing, and the housing can provide space for installing the card tray and card holder apparatus and protect the card tray and card holder apparatus. The circuit board 300 is typically fastened in the housing. The circuit board 300 is a base of the card tray and card holder apparatus, with the card pressing cover 100, the detection and ejection mechanism 200, the card tray 400, and the card holder 500 directly or indirectly installed on the circuit board 300. Optionally, the circuit board 300 may be a main board of the electronic device, a sub-board of the electronic device, or another circuit board in the electronic device, which is not limited in the embodiments of this application.

The card holder 500 is electrically connected to the circuit board 300, thereby implementing power supply connection and communication connection with the circuit board 300. The card holder 500 may be directly fastened to the circuit board 300 by using a surface installing process; or certainly, the card holder 500 may be disposed on the card pressing cover 100 and indirectly fastened to the circuit board 300 via the card pressing cover 100; or certainly, the card holder 500 may be electrically connected to the circuit board 300 indirectly via the card pressing cover 100.

In an embodiment of this application, the card pressing cover 100 is fastened to the circuit board 300, and the card pressing cover 100 and the circuit board 300 together form the backbone of the card tray and card holder apparatus. The card pressing cover 100 may be fastened to the circuit board 300 by bonding, clamping, welding, connection using connecting pieces (for example, rivets or threaded connectors), or the like. A specific manner for fastening the card pressing cover 100 to the circuit board 300 is not limited in the embodiments of this application.

A first accommodating space is formed by the card pressing cover 100 and the circuit board 300, and the card tray 400 and the card holder 500 are both disposed in the first accommodating space. The card tray 400 is configured to hold a smart card 800, for example, a SIM card. The card tray 400 can be moved in and out of the first accommodating space, so that the smart card 800 can be loaded or removed. In a case that the card tray 400 is in the first accommodating space, the card tray 400 carrying the smart card 800 is held in the first accommodating space. The card pressing cover 100 can also press the smart card 800 against the card tray 400, so that the smart card 800 can be in more reliable electrical contact with the card holder 500, ensuring cooperation stability. In an embodiment of this application, the card tray 400 includes a detection matching portion 410 and a lever matching portion 420.

The card tray 400 may be in an installed state or a removed state. In the installed state, the card tray 400 is held in the first accommodating space, and the smart card 800 in the card holder 500 can be in electrical contact with the card holder 500, so that a communication connection between the smart card 800 and the circuit board 300 is implemented using the card holder 500. In this case, the smart card 800 is loaded using the card tray 400. When the card tray 400 is in the removed state, at least part of the card tray 400 is moved out of the first accommodating space. In this case, a user can remove the card tray 400 so as to remove the smart card 800.

In an embodiment of this application, the card tray 400 may hold one or more smart cards 800, and one or more card holders 500 may be provided. Each card holder 500 can accommodate one smart card 800, so that each smart card 800 can communicate with the circuit board 300 through a separate card holder 500. Certainly, the embodiments of this application do not limit a mapping between the smart card 800 and the card holder 500 in terms of quantity.

The detection and ejection mechanism 200 is configured to eject the card tray 400 for removing the card tray 400, and detect whether the card tray 400 is installed in place or detect a card tray state. In the embodiment of this application, the card tray state includes the installed state and the removed state.

In an embodiment of this application, the detection and ejection mechanism 200 is disposed on the card pressing cover 100. Optionally, the circuit board 300, the card pressing cover 100, and the detection and ejection mechanism 200 are arranged sequentially in a direction perpendicular to the circuit board 300. Alternatively, the circuit board 300, the detection and ejection mechanism 200, and the card pressing cover 100 are arranged sequentially in a direction perpendicular to the circuit board 300.

The detection and ejection mechanism 200 is fastened to the card pressing cover 100, so as to be indirectly fastened to the circuit board 300 via the card pressing cover 100 for completing installing. In this case, without being directly disposed on the circuit board 300, the detection and ejection mechanism 200 does not occupy the on-board space of the circuit board 300.

The detection and ejection mechanism 200 includes a lever 210 and a detection portion 220. The lever 210 is configured to drive the card tray 400 to move, allowing for removing of the card tray 400. The detection portion 220 cooperates with the detection matching portion 410 and is configured to detect the card tray state.

The lever 210 is rotatably disposed on the card pressing cover 100 and therefore can rotate with respect to the card pressing cover 100. In an optional solution, the lever 210 is rotatably connected to the card pressing cover 100 directly. In another optional solution, the lever 210 may be directly rotatably disposed on a protective cover 600 described later, so as to be indirectly disposed on the card pressing cover 100 via the protective cover 600.

The electronic device is provided with an ejector pin hole, typically on the housing of the electronic device. A first end portion of the lever 210 is disposed opposite the ejector pin hole. The ejector pin hole allows an ejector pin 900 to pass through to push the first end portion of the lever 210, so as to drive the lever 210 to rotate. A second end portion of the lever 210 is disposed opposite the lever matching portion 420. The second end portion of the lever 210 is able to rotate with the lever 210 in a first direction and come into contact with the lever matching portion 420, so that the second end portion of the lever 210 is able to push the lever matching portion 420. In this way, the entire card tray 400 is pushed, driving at least part of the card tray 400 to move out of the first accommodating space. Pushed by the second end portion of the lever 210, the card tray 400 holding the smart card 800 is moved out of the housing for the purpose of removing.

Similarly, while the card tray 400 is being installed, the user will press the card tray 400, and the lever matching portion 420 will come into contact the second end portion of the lever 210, so that the second end portion drives the lever 210 to rotate in a second direction and return to its original position. It should be noted that the first direction is opposite to the second direction.

In an embodiment of this application, the detection portion 220 is disposed on the card pressing cover 100. The detection portion 220 is arranged corresponding to the detection matching portion 410 and therefore can cooperate with the detection matching portion 410 to detect the card tray state. It should be noted that the card tray state herein includes the installed state and the removed state.

The card tray and card holder apparatus according to the embodiment of this application is an improvement based on the related art. The detection and ejection mechanism 200 is disposed on the card pressing cover 100. This ensures proper functioning of the detection and ejection mechanism 200 and avoids the detection and ejection mechanism 200 from being directly disposed on the circuit board 300, thereby avoiding occupation of the on-board space of the circuit board 300. In this case, the prior-art problem of low on-board space utilization of the circuit board 300 caused by the card tray and card holder apparatus occupying a large on-board space is solved.

As described above, the card pressing cover 100 can press the smart card 800 tightly so that the smart card 800 is in closer electrical contact with the card holder 500. In an optional solution, the card pressing cover 100 includes an elastic bending and pressing portion 116. The elastic bending and pressing portion 116 bends towards the first accommodating space, able to press the smart card 800 on the card tray 400 tightly after the card tray 400 is installed in place, making the electrical connection between the smart card 800 and the card holder 500 more stable. Optionally, a plurality of elastic bending and pressing portions 116 are provided and arrayed on the card pressing cover 100, specifically arrayed in the cover body 110 described later.

Certainly, the card pressing cover 100 may also secure the card tray 400 and the smart card 800, so that the card tray 400 can be more reliably held in the first accommodating space without the action of external force. In an optional solution, the card pressing cover 100 may include a clasping spring arm 114, the clasping spring arm 114 may include an elastic protrusion, and the card tray 400 may be provided with a positioning notch 400b1. In the process of installing the card tray 400 into the first accommodating space, the clasping spring arm 114 is elastically deformed, which in turn makes the elastic protrusion elastically fit into the positioning notch 400b1 and finally implements fixation of the card tray 400 in the first accommodating space. In the process of removing the card tray 400, further removing of the card tray 400 can be implemented by controlling the card tray 400 to move towards the direction of removing to cause the elastic protrusion to separate from the positioning notch 400b1.

During the process of installing the card tray 400, the user presses the card tray 400 holding the smart card 800 into the housing through a slot on the housing. During this process, under the external force from the user, the card tray 400 raises the elastic protrusion until the positioning notch 400b1 moves to a position opposite the elastic protrusion. Eventually, the elastic protrusion is elastically fit into the positioning notch 400b1, implementing the installing of the card tray 400 into the first accommodating space. At the same time, the detection portion 220 cooperates with the detection matching portion 410 to determine that the card tray 400 is installed in place.

In the process of removing the card tray 400, the user threads the ejector pin 900 through the ejector pin hole to press the first end portion of the lever 210, thereby causing the lever 210 to rotate. The first end portion of the lever 210 rotates in a direction leaving the ejector pin hole. Since the second end portion of the lever 210 is disposed opposite the rod matching portion 420, and a rotation pivot of the lever 210 is located between the two end portions, the second end portion can rotate in a direction approaching the slot during the rotation of the lever 210 to push the lever matching portion 420, eventually causing at least part of the card tray 400 to be pushed out of the housing via the slot. During this process, the pushing force applied by the lever 210 to the lever matching portion 420 can overcome the elastic force between the elastic protrusion and the positioning notch 400b1, so that the card tray 400 moves out of the housing. Finally, the user can remove the card tray 400. When the card tray 400 is moving out of the housing, the detection portion 220 cooperates with the detection matching portion 410 to determine that the card tray 400 is in the removed state.

In an embodiment of this application, typically the card pressing cover 100 is welded to the circuit board 300. Therefore, the card pressing cover 100 may be provided with a welding fillet 118. The welding fillet 118 fits into the circuit board 300 to increase the welding area, thereby improving the assembly stability.

In an optional solution, the circuit board 300 may be provided with a positioning hole 310, and the card pressing cover 100 may include a plug positioning portion 115. The plug positioning portion 115 is mated with the positioning hole 310, which can further avoid the possible displacement of the card pressing cover 100 during the welding process, thereby further improving the assembly quality.

For easy installing of the card tray 400, the card pressing cover 100 may include a guided bending portion 119. The guiding bent portion 119 can guide the card tray 400, allowing the card tray 400 to slide into the first accommodating space more easily, thereby facilitating assembly.

In an embodiment of this application, the card pressing cover 100 may be provided with a second observation hole 117. A plurality of second observation holes 117 may be provided and are arrayed, allowing an operator to observe the assembly status in the first accommodating space through the second observation holes 117.

Figure 10:
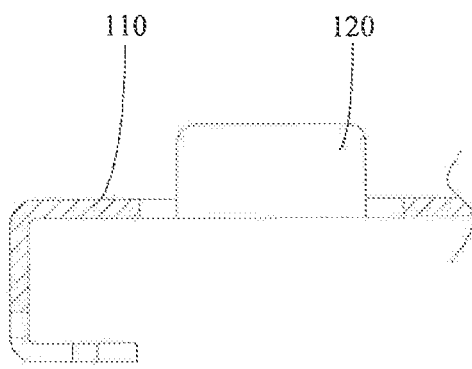
Figure 11:
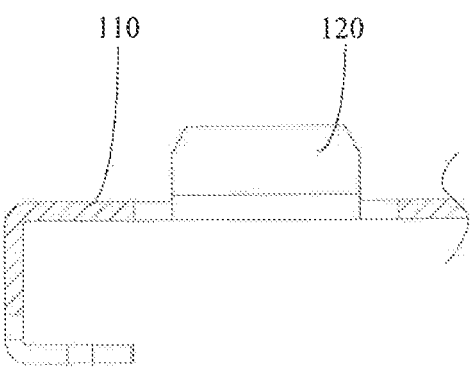
Figure 12:
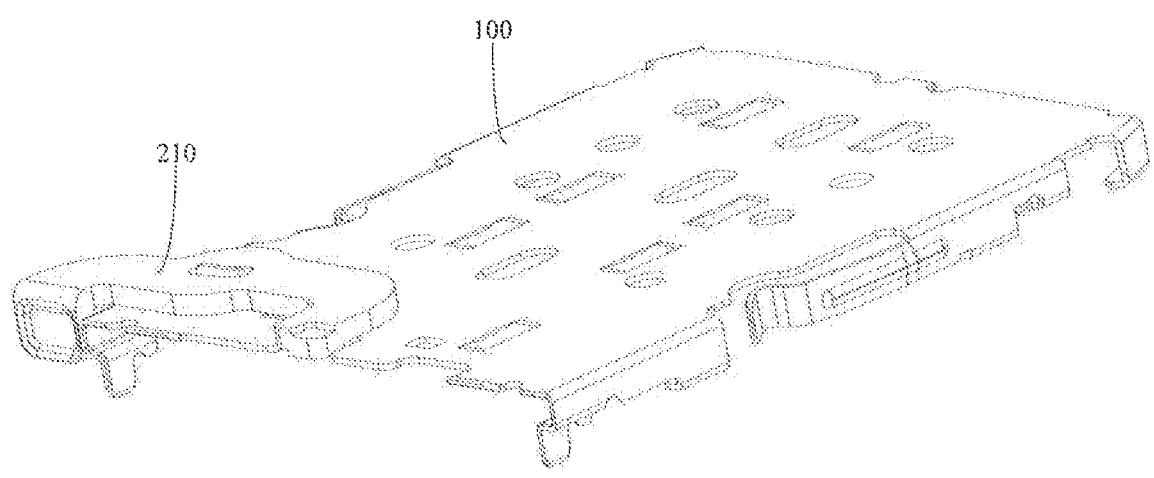
FIG. 12 and FIG. 13 are schematic diagrams of a card pressing cover and a lever that are assembled according to an embodiment of this application, viewed from different angles.
Figure 13:
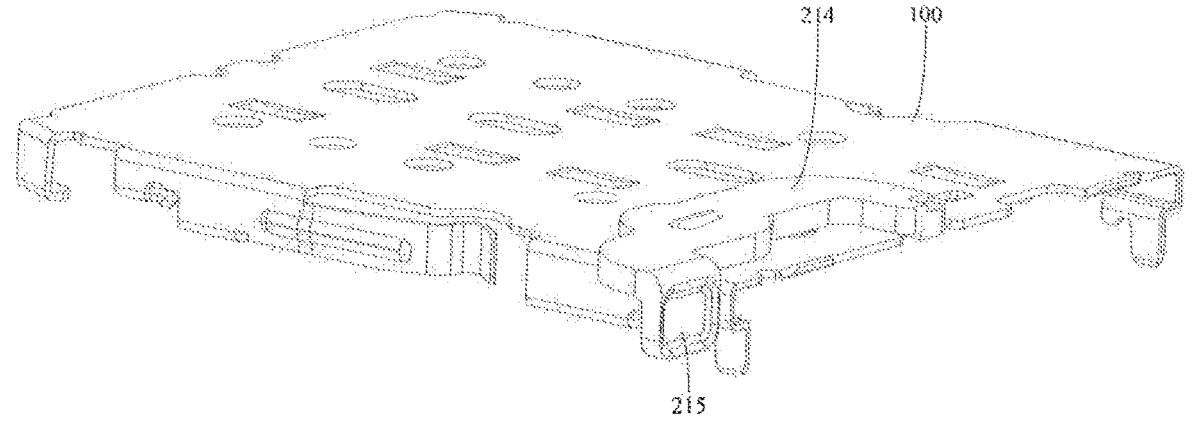
Figure 14:
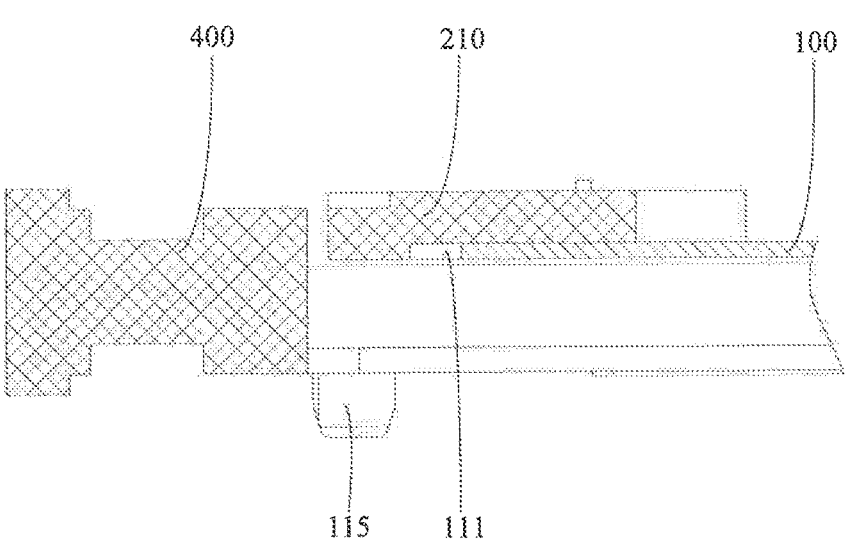
FIG. 14 to FIG. 16 are cross-sectional views of different portions of a card tray and card holder apparatus according to an embodiment of this application.
Figure 15:
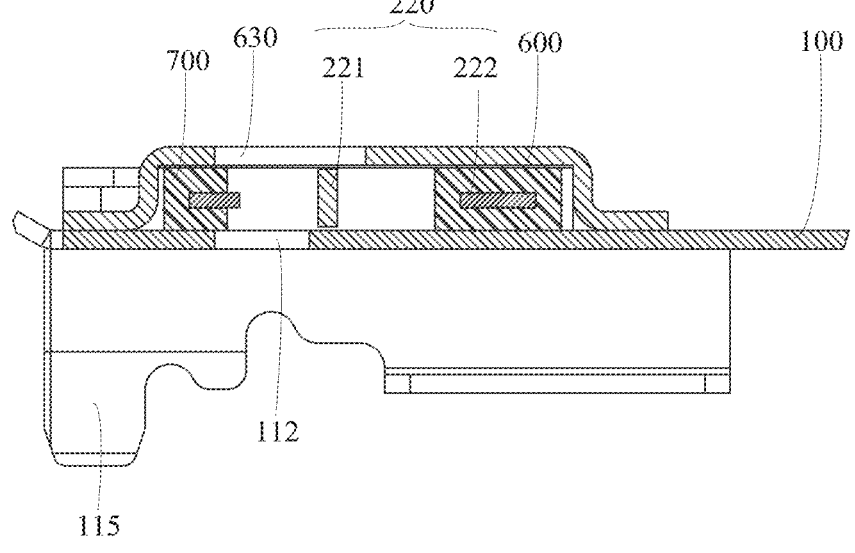
Figure 16:
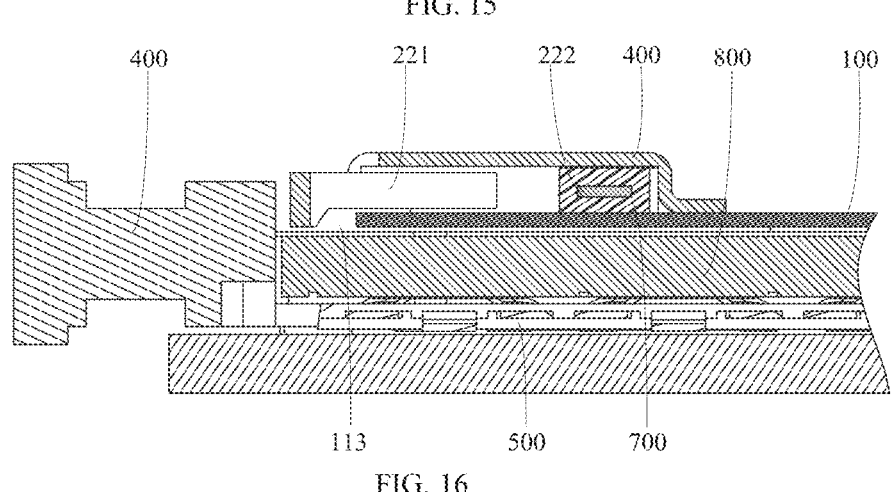
Figure 17:
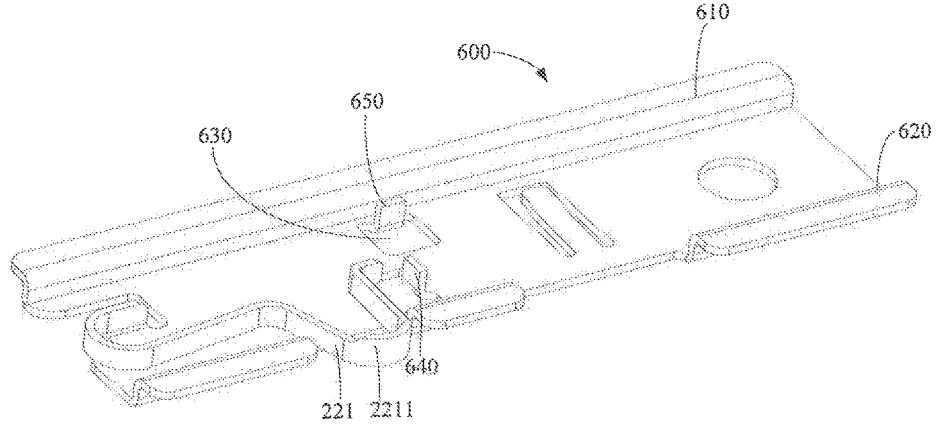
FIG. 17 and FIG. 18 are schematic structural diagrams of a protective cover according to an embodiment of this application, viewed from different angles.
Figure 18:
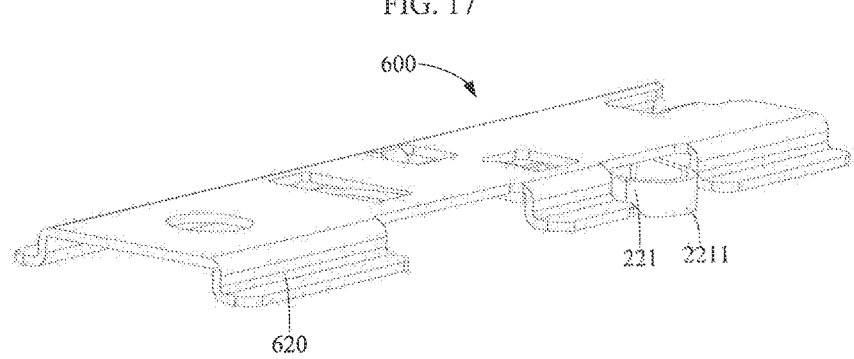
Figure 19:
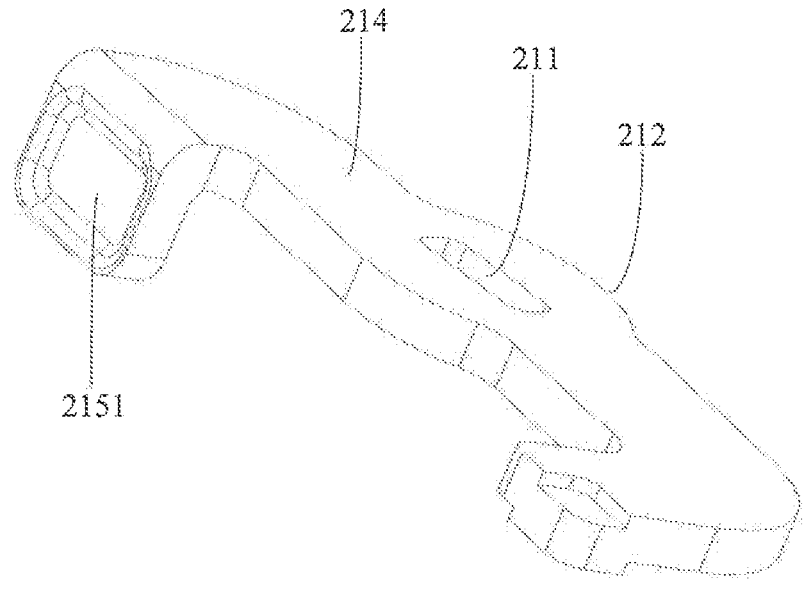
FIG. 19 and FIG. 20 are schematic structural diagrams of a lever according to an embodiment of this application, viewed from different angles.
Figure 20:
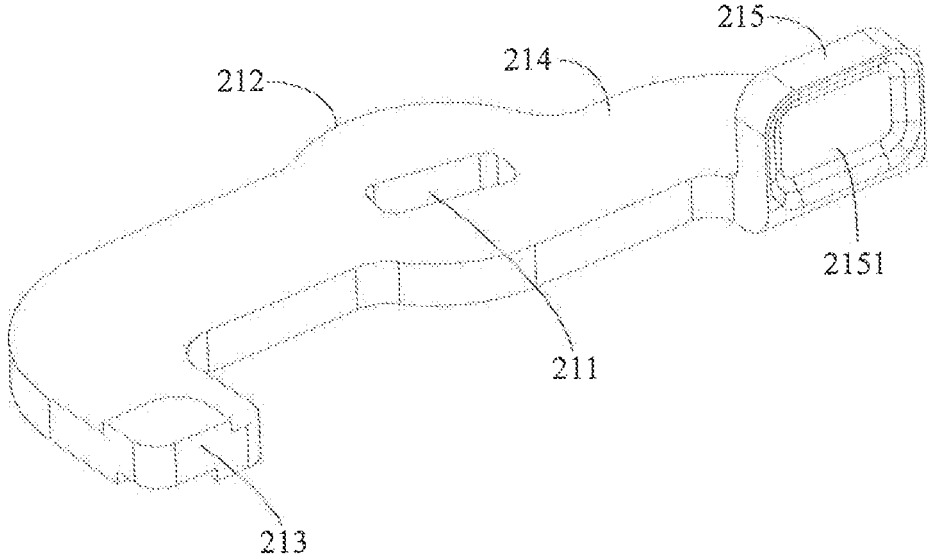
Figure 21:
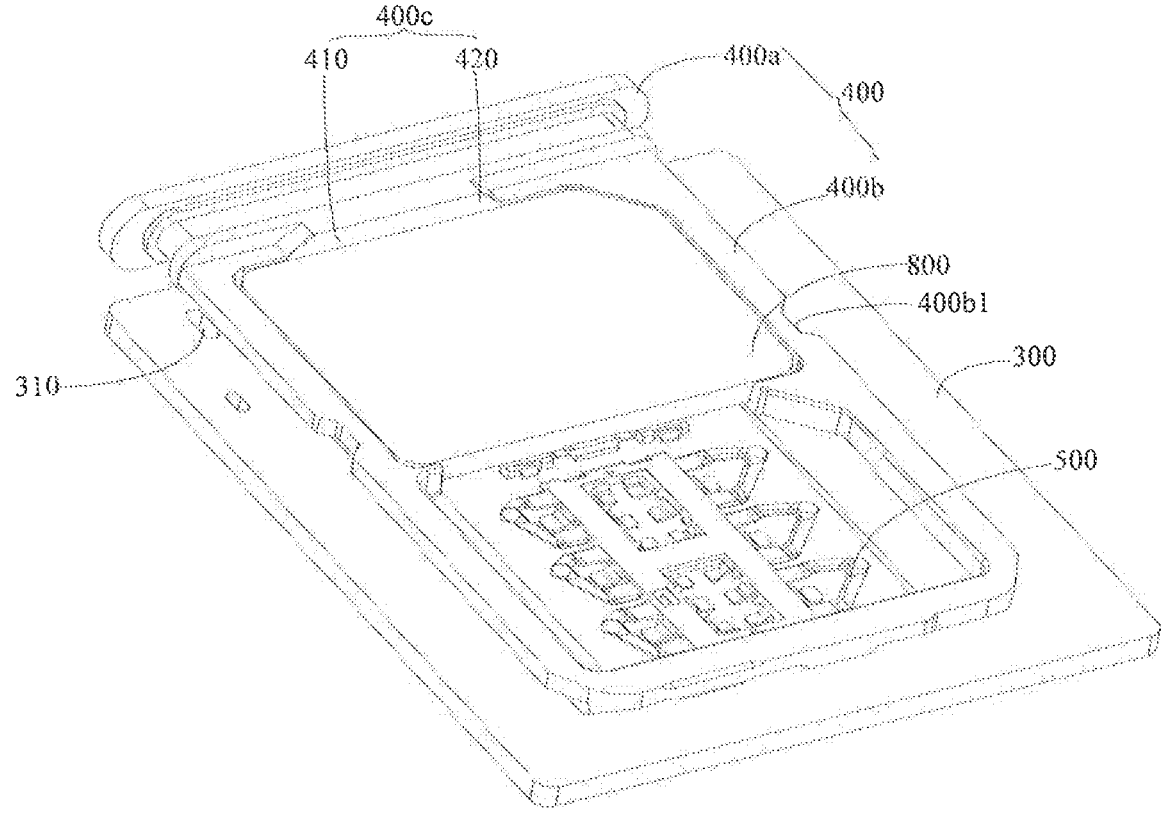
FIG. 21 is a partial schematic structural diagram of a card tray and card holder apparatus according to an embodiment of this application.

In an embodiment of this application, the card pressing cover 100 may include a cover body 110 and a connecting shaft 120 disposed on the cover body 110. The lever 210 is provided with a rotation matching hole 211, and the connecting shaft 120 rotatably fits into the rotation matching hole 211. In an optional solution, the connecting shaft 120 may be a cylindrical connecting shaft, the rotation matching hole 211 may be a round hole, and the cylindrical connecting shaft and the round hole fit with each other rotatably. Refer to FIG. 10 and FIG. 11. For ease of assembly, in an optional solution, an end portion of the connecting shaft 120 may be designed with a chamfered right angle or rounded corner.

In another optional solution, a cross section of the connecting shaft 120 may be of an elongate shape, and the rotation matching hole 211 may be a slot hole. The connecting shaft 120 rotatably fits into the rotation matching hole 211 within a preset angle range. In this case, the slot hole cooperates with the connecting shaft 120 with the elongate-shaped cross section, allowing the lever 210 to rotate within the limited preset angle range. Therefore, the lever 210 can rotate by an angle as required for installing and removing the card tray 400. In addition, the rotation matching hole 211 being a slot hole has slight influence on the strength of the lever 210. Optionally, the cross section of the connecting shaft 120 is a rectangle. It should be noted that the cross section of the connecting shaft 120 refers to a cross section obtained in a direction perpendicular to the axis of the connecting shaft 120. The elongate shape has length and width dimensions, where the length dimension is greater than the width dimension.

Optionally, the preset angle range may be 30°, 45°, or the like. Those skilled in the art can determine the preset angle range according to the rotation range of the lever 210 required for removing the card tray 400, and the embodiment of this application does not limit the specific value of the preset angle range.

The connecting shaft 120 may be fastened to the cover body 110 by assembly. For example, the connecting shaft 120 can be fastened to the cover body 110 by welding, interference-fit clamping, or the like. Certainly, the connecting shaft 120 may alternatively be integrally formed with the cover body 110, which spares the need of assembling. Specifically, the connecting shaft 120 and the cover body 110 may be formed by injection molding, bending process, or cutting process, which is not limited in this application.

In an optional solution, the connecting shaft 120 may be a sheet structure formed by bending the cover body 110. This means that the connecting shaft 120 may be formed by tearing from the blank used to form the cover body 110. Certainly, in this case, on the cover body 110, a torn hole is formed in the area where the connecting shaft 120 is formed. Without the need of providing a separate connecting shaft 120, such structure is easy to form and saves materials.

In a further technical solution, the card tray and card holder apparatus according to the embodiment of this application may further include a protective cover 600. The protective cover 600 is disposed on the card pressing cover 100. The protective cover 600 and the card pressing cover 100 form a second accommodating space. The lever 210 may be disposed in the second accommodating space. The second accommodating space may be used to protect the lever 210 and prevent external components from interfering with the movement of the lever 210. Certainly, at least part of the detection portion 220 may be disposed in the second accommodating space for protection purposes.

The lever 210 may include a curved flange 212, and the curved flange 212 is located on the edge of the lever 210 facing away from the lever matching portion 420. The protective cover 600 may include an inner supporting side wall 610. The inner supporting side wall 610 abuts against the card pressing cover 100 and is located on a side of the lever 210 facing away from the ejector pin hole. The curved flange 212 is in rolling fit with the inner supporting side wall 610. The curved flange 212 serves as the pivot of rotation of the lever 210, allowing the lever 210 to rotate around the connecting shaft 120 more easily and facilitating the application of pushing force during rotation of the lever 210. During the process of removing the card tray 400, the inner supporting side wall 610 can also limit the position of the lever 210, thereby restricting the rotation range of the lever 210 and avoiding excess and undesired rotation of the lever 210.

The protective cover 600 may further include an outer supporting side wall 620. The outer supporting side wall 620 abuts against the card pressing cover 100. The outer supporting side wall 620 is located on a side of the lever 210 facing the lever matching portion 420. When the lever 210 rotates in a second direction, the outer supporting side wall 620 limits the position of the lever 210, where the first direction is opposite to the second direction. During the process of installing the card tray 400, the lever matching portion 420 pushes the second end portion of the lever 210 to drive the lever 210 to rotate back (that is, rotating in the second direction). The outer supporting side wall 620 can limit the position of the lever 210, thereby preventing the lever 210 from rotating back excessively. In this way, the first end portion of the lever 210 can be prevented from missing the ejector pin hole due to excessive rotation.

In the card tray and card holder apparatus according to the embodiment of this application, an end portion of the card pressing cover 100 closer to the lever 210 is provided with a first escape opening 111, the first end portion of the lever 210 is provided with a first thickening portion 213, and the first thickening portion 213 is located in a first escape opening 111. The first thickening portion 213 can enlarge the area of the second end portion of the lever 210 in cooperation with the lever matching portion 420, so that the lever 210 can push the lever matching portion 420 more effectively. This prevents the second end portion of the lever 210 and the lever matching portion 420 from being deformed or jammed due to the reduced contact area.

As described above, the detection portion 220 is configured to detect the card tray state, where the card tray state includes the installed state and the removed state. In an embodiment of this application, there may be various types of detection portions 220. The detection portion 220 may be an optical detection portion or an electrical detection portion. For example, in a case that the detection portion 220 is an optical detection portion, the detection portion 220 can determine the card tray state by acquiring images from the detection cooperation portion 410.

In an optional solution, when the card tray 400 is in the installed state, the detection matching portion 410 is in contact with the detection portion 220. When the card tray 400 is in the removed state, the detection matching portion 410 is separated from the detection portion 540. In this case, the state of the card tray 400 is determined by checking whether the detection portion 220 is in contact with the detection matching portion 410, so as to check whether the card tray 400 is installed in place. For example, the detection portion 220 may be a self-capacitance plate. When the detection matching portion 410 is separated from the detection portion 220, the capacitance value of the detection portion 220 is a first capacitance value; when the detection matching portion 410 is in contact with the detection portion 220, the capacitance value of the detection portion 220 is a second capacitance value. The first capacitance value is unequal to the second capacitance value. During the detection process, the card tray state can be determined based on the capacitance value.

In a further technical solution, the detection portion 220 may include a detection spring piece 221 and a detection terminal 222. One end of the detection spring piece 221 is connected to the protective cover 600 or the card pressing cover 100 and the other end of the detection spring piece 221 is an electrical connection end. The detection terminal 222 is disposed on the protective cover 600 or the card pressing cover 100. When the card tray 400 is in a first state, the detection matching portion 410 is in contact with the detection spring piece 221 and drives the electrical connection end to be separated from the detection terminal 222; and when the card tray 400 is in a second state, the detection matching portion 410 is separated from the detection spring piece 221, and the electrical connection end is in electrical contact with the detection terminal 222. One of the first state and the second state is the removed state, and the other one is the installed state.

For example, the detection spring piece 221 may be a grounding spring piece. In this case, the detection terminal 222 can be connected to a signal source. In a case that the detection terminal 222 is in contact with the electrical connection end, the detection terminal 222 is grounded using the detection spring piece 221, and the electronic device can detect that the signal from the detection terminal 222 is a low level. In a case that the detection terminal 222 is separated from the electrical connection end, the detection terminal 222 is not grounded using the electrical connection end, and the electric device can detect that the signal from the detection terminal 222 is a high level. During the specific detection process, the electronic device can determine the card tray state by checking whether the level signal of the detection terminal 222 is a high-level signal or a low-level signal. It should be noted that the low-level signal and high-level signal herein are relative concepts, and the embodiments of this application do not limit the specific values of the low-level signal and high-level signal.

In an optional solution, the first state is the removed state, and the second state is the installed state. In this case, during the process of removing the card tray 400, as the card tray 400 gradually moves out of the first accommodating space, the detection matching portion 410 gradually comes in contact with the detection spring piece 221, thereby driving the detection spring piece 221 to separate from the detection terminal 222. As a result, the electrical connection between the detection spring piece 221 and the detection terminal 222 is broken, and such state is identified as the removed state by circuit detection. During the process of installing the card tray 400, as the card tray 400 gradually moves into the first accommodating space, the detection matching portion 410 is gradually separated from the detection spring piece 221, and the detection spring piece 221 resumes contact with the detection terminal 222 under the elastic restoring force. In this case, the detection spring piece 221 is electrically connected to the detection terminal 222, and such state is identified as the installed state by circuit detection.

In another optional solution, the first state is the installed state, and the second state is the removed state. In this case, during the process of removing the card tray 400, as the card tray 400 gradually moves out of the first accommodating space, the detection matching portion 410 is gradually separated from the detection spring piece 221, and the detection spring piece 221 resumes contact with the detection terminal 222 under the elastic restoring force. As a result, the detection spring piece 221 is electrically connected to the detection terminal 222, and such state is identified as the installed state by circuit detection. During the process of installing the card tray 400, as the card tray 400 gradually moves into the first accommodating space, the detection matching portion 410 gradually comes in contact with the detection spring piece 221, thereby driving the detection spring piece 221 to deform and separate from the detection terminal 222. As a result, the electrical connection between the detection spring piece 221 and the detection terminal 222 is broken, and such state is identified as the removed state by circuit detection.

In an embodiment of this application, at least one of the card pressing cover 100 and the protective cover 600 may be provided with an anti-dust hole 112. The anti-dust hole 112 is provided opposite the detection portion 220 and communicates with the second accommodating space. As described above, the detection portion 220 includes the detection spring piece 221 and the detection terminal 222. During the process of removing and installing the card tray 400, the detection spring piece 221 and the detection terminal 222 switch between the contacted and separated states. To prevent constant contact between the detection spring piece 221 and the detection terminal 222 caused by foreign matters such as dust deposited therebetween, the anti-dust hole 112 can be made in communication with the second accommodating space and disposed opposite the detection portion 220. This allows the dust between the detection spring piece 221 and the detection terminal 222 to be cleared out of the second accommodating space, thereby avoiding deposition of dust.

An insulation portion 700 may be fastened in the second accommodating space. Optionally, the insulation portion 700 may be a plastic part injection-molded on the protective cover 600. The detection terminal 222 is fastened to the insulation portion 700, and the detection terminal 222 is insulatively connected to the protective cover 600 via the insulation portion 700. In a further technical solution, the protective cover 600 may include a first positioning flange 640 and a second positioning flange 650. The first positioning flange 640 and the second positioning flange 650 may intersect, and specifically, the first positioning flange 640 may be perpendicular to the second positioning flange 650. The plastic part may be injection-molded on the first positioning flange 640 and the second positioning flange 650, thereby improving the stability of connection with the protective cover 600.

In an embodiment of this application, the card pressing cover 100 may be provided with a second escape opening 113, and at least part of the detection spring piece 221 extends into the second escape opening 113. In this case, at least part of the detection spring piece 221 can be accommodated in the second escape opening 113, so that the detection spring piece 221 can better fit into the card pressing cover 100.

In a further technical solution, the detection spring piece 221 may be provided with a second thickening portion 2211, and at least part of the second thickening portion 2211 extends into the second escape opening 113. At least part of the second thickening portion 2211 can be accommodated in the second escape opening 113, and therefore the foregoing structure can easily increase the contact area of the detection spring piece 221, without changing the overall size of the electronic device. This allows for more stable cooperation between the detection spring piece 221 and the detection terminal 222.

In an embodiment of this application, the detection spring piece 221 may be integrally formed with the protective cover 600, the detection spring piece 221 may be integrally formed with the card pressing cover 100, or the detection spring piece 221 may be installed to the protective cover 600 or the card pressing cover 100. The integrally formed structure described above has the advantage of easy installing.

In a further optional solution, the card pressing cover 100 or the protective cover 600 may be provided with a first observation hole 630 corresponding to the detection portion 220. The first observation hole 630 allows an operator to observe the cooperation from the detection portion 220.

In an embodiment of this application, the lever 210 may come with a plurality of structures. In an optional solution, the lever 210 includes a main body 214 and a bending portion 215 disposed at an end portion of the main body 214. The main body 214 is in rotatable fit with the card pressing cover 100, the main body 214 is located on a first side of the card pressing cover 100, and the bending portion 215 is located on a second side of the card pressing cover 100. The first side and the second side are two adjacent sides of the card pressing cover 100, a stacking direction of the main body 214 on the card pressing cover 100 is a thickness direction of the card tray 400, and the bending portion 215 is disposed opposite the ejector pin hole. In this case, the bending portion 215 is closer to the card tray 400 in the thickness direction of the electronic device, thereby alleviating the problem of uneven pressure on the card tray 400 when the bending portion 215 is being pushed by an ejector pin 900.

In a further technical solution, the main body 214 may be a first sheet structure, and a thickness direction of the first sheet structure is the same as a stacking direction of the detection and ejection mechanism 200 on the card pressing cover 100. This helps reduce the thickness of the card tray and card holder apparatus, facilitating thinner design of the electronic device.

In a further technical solution, the bending portion 215 may be a second sheet structure, and a thickness direction of the second sheet structure is the same as a moving direction of the card tray 400. In this case, the larger area on the bending portion 215 is opposite the ejector pin 900, allowing the ejector pin 900 to drive the lever 210 more stably.

As described above, removing of the card tray 400 requires the user to press the first end portion of the lever 210 by using the ejector pin 900. When the user threads the ejector pin 900 through the ejector pin hole to press the first end portion of the lever 210, the end portion of the ejector pin 900 in contact with the lever 210 is likely to slip and damage another component of the electronic device. In view of this, in an optional solution, a surface, facing the ejector pin hole, of the first end portion of the lever 210 is provided with a limiting recess 2151. The opening of the limiting recess 2151 faces the ejector pin hole, and the bottom wall of the limiting recess 2151 facing the opening serves as the acting surface of the ejector pin. When the ejector pin pushes the first end portion of the lever 210 to rotate, the end portion of the ejector pin 900 in contact with the lever 210 can extend into the limiting recess 2151. Limited by the limiting recess 2151, the ejector pin 900 can be prevented from slipping and causing adverse consequences.

Certainly, the electronic device according to the embodiment of this application can also use other ways to solve the possible damage caused by the ejector pin 900. In another optional solution, the surface, facing the ejector pin hole, of the first end portion of the lever 210 may be provided with an anti-slip structure. Specifically, the anti-slip structure may be a frosted surface or have anti-slip textures. In this case, the anti-slip structure can increase the coefficient of friction between the lever 210 and the end portion of the ejector pin 900, reducing the slip probability of the end portion of the ejector pin 900.

In an embodiment of this application, the card tray 400 may come with a variety of structures. Specifically, the detection matching portion 410 and the lever matching portion 420 may each be a protrusion formed on the card tray 400. In other words, the detection matching portion 410 is a first protrusion and the lever matching portion 420 is a second protrusion.

In a further technical solution, the card tray 400 may include a card tray cap 400a and a card tray body 400b. The card tray body 400b is provided with a card slot for accommodating a smart card, a side of the card tray cap 400a facing the card tray body 400b is provided with a bar-shaped boss 400c protruding from the opening of the card slot, and the bar-shaped boss 400c includes the detection matching portion 410 and the lever matching portion 420. Such arrangement helps simplify the structures of the detection matching portion 410 and the lever matching portion 420.

Based on the card tray and card holder apparatus disclosed in the embodiments of this application, an embodiment of this application discloses an electronic device, and the disclosed electronic device includes the card tray and card holder apparatus described in the foregoing embodiments.

In the embodiment of this application, a housing includes an inner chamber, a slot, and an ejector pin hole. Both the slot and the ejector pin hole communicate with the inner chamber. The ejector pin hole allows the ejector pin 900 to pass through for removing the card tray 400. The slot allows the card tray 400 to pass through, so as to implement installing and removing of the card tray 400.

The housing typically includes a middle frame. Both the slot and the ejector pin hole may be provided on the middle frame. During use of the electronic device (such as a mobile phone or a tablet computer), the middle frame usually does not face the user. Therefore, providing the slot and the ejector pin hole on the middle frame can improve the appearance of the electronic device and enhance the visual experience of users.

The electronic device disclosed in this embodiment of this application may be a mobile phone, a tablet computer, an e-book reader, a wearable device, a game console, or another type of device, which is not specifically limited in the embodiment of this application.

The foregoing embodiments of this application focus on the differences between the embodiments. In absence of conflicts, different features of improvement in the embodiments may be combined to preferred embodiments, which are not described herein again for the purpose of brevity.

The foregoing descriptions are merely embodiments of this application and are not intended to limit this application. For a person skilled in the art, this application may have various modifications and variations. Any modifications, equivalent replacements, and improvements made without departing from the spirit and principle of this application shall fall within the scope of the claims of this application.

What is claimed is:

1. A card tray and card holder apparatus, applied to an electronic device and comprising a card pressing cover, a detection and ejection mechanism, a circuit board, a card tray, and a card holder, wherein the card pressing cover is fastened to the circuit board, a first accommodating space is formed by the card pressing cover and the circuit board, and the card tray and the card holder are both disposed in the first accommodating space;

the card tray comprises a detection matching portion and a lever matching portion;

the detection and ejection mechanism is disposed on the card pressing cover, and the detection and ejection mechanism comprises a lever and a detection portion, wherein the lever is rotatably disposed on the card pressing cover, the detection portion is disposed on the card pressing cover, a first end portion of the lever is disposed opposite an ejector pin hole of the electronic device, and a second end portion of the lever is disposed opposite the lever matching portion, wherein the second end portion of the lever is able to rotate with the lever in a first direction and come into contact with the lever matching portion, so as to drive at least part of the card tray to move out of the first accommodating space; and the detection portion cooperates with the detection matching portion, and the detection portion is configured to detect a card tray state, wherein the card tray state comprises an installed state and a removed state, wherein the card tray and card holder apparatus further comprises a protective cover, the protective cover is disposed on the card pressing cover, a second accommodating space is formed by the protective cover and the card pressing cover, and the lever is disposed in the second accommodating space, wherein the lever comprises a curved flange, wherein the curved flange is located on an edge of the lever facing away from the lever matching portion, the protective cover comprises an inner supporting side wall, the inner supporting side wall abutting ag e card pressing cover and located on a side of the lever facing away from the ejector pin hole, and the curved flange is in rolling contact with the inner supporting side wall.

2. The card tray and card holder apparatus according to claim 1, wherein the card pressing cover comprises a cover body and a connecting shaft disposed on the cover body, the lever is provided with a rotation matching hole, and the connecting shaft rotatably fits into the rotation matching hole within a preset angle range.

3. The card tray and card holder apparatus according to claim 2, wherein the connecting shaft is integrally formed with the cover body, and the connecting shaft is a sheet structure formed by bending the cover body.

4. The card tray and card holder apparatus according to claim 1, wherein the protective cover further comprises an outer supporting side wall, wherein the outer supporting side wall abuts against the card pressing cover, the outer supporting side wall is located on a side of the lever facing the lever matching portion, and when the lever rotates in a second direction, the outer supporting side wall limits the position of the lever, the first direction being opposite to the second direction.

5. The card tray and card holder apparatus according to claim 2, wherein a cross section of the connecting shaft is of an elongate shape, and the rotation matching hole is a slot hole.

6. The card tray and card holder apparatus according to claim 1, wherein the card tray and card holder apparatus further comprises a protective cover, the protective cover is disposed on the card pressing cover, a second accommodating space is formed by the protective cover and the card pressing cover, at least part of the detection portion and the lever are both disposed in the second accommodating space, and when the card tray is in the installed state, the detection matching portion is in contact with the detection portion; and when the card tray is in the removed state, the detection matching portion is separated from the detection portion.

7. The card tray and card holder apparatus according to claim 6, wherein the detection portion comprises a detection spring piece and a detection terminal, a first end of the detection spring piece is connected to the protective cover or the card pressing cover and a second end of the detection spring piece is an electrical connection end, and the detection terminal is disposed on the protective cover or the card pressing cover, wherein when the card tray is in a first state, the detection matching portion is in contact with the detection spring piece and drives the electrical connection end to be separated from the detection terminal; and when the card tray is in a second state, the detection matching portion is separated from the detection spring piece, and the electrical connection end is in electrical contact with the detection terminal; wherein one of the first state and the second state is the installed state, and the other one is the removed state.

8. The card tray and card holder apparatus according to claim 7, wherein the card pressing cover is provided with a second escape opening, and at least part of the detection spring piece extends into the second escape opening.

9. The card tray and card holder apparatus according to claim 8, wherein the detection spring piece is provided with a second thickening portion, and at least part of the second thickening portion extends into the second escape opening.

10. The card tray and card holder apparatus according to claim 7, wherein the detection spring piece is integrally formed with the protective cover, or the detection spring piece is integrally formed with the card pressing cover, or the detection spring piece is installed to the protective cover or the card pressing cover.

11. The card tray and card holder apparatus according to claim 10, wherein in a case that the detection spring piece is integrally formed with the protective cover, an insulation portion is fastened in the second accommodating space, the detection terminal is fastened to the insulation portion, and the detection terminal is insulatively connected to the protective cover via the insulation portion.

12. The card tray and card holder apparatus according to claim 1, wherein the lever comprises a main body and a bending portion disposed at an end portion of the main body, the main body is in rotatable fit with the card pressing cover, the main body is located on a first side of the card pressing cover, and the bending portion is located on a second side of the card pressing cover, wherein the first side and the second side are two adjacent sides of the card pressing cover, a stacking direction of the main body on the card pressing cover is a thickness direction of the card tray, and the bending portion is disposed opposite the ejector pin hole.

13. The card tray and card holder apparatus according to claim 12, wherein the main body is a first sheet structure, and a thickness direction of the first sheet structure is same as a stacking direction of the detection and ejection mechanism on the card pressing cover.

14. The card tray and card holder apparatus according to claim 13, wherein the bending portion is a second sheet structure, and a thickness direction of the second sheet structure is same as a moving direction of the card tray for installing and removing.

15. The card tray and card holder apparatus according to claim 1, wherein the card tray comprises a card tray cap and a card tray body, the card tray body provides an installing space for accommodating a smart card, a side of the card tray cap facing the card tray body is provided with a bar-shaped boss protruding from an opening of the installing space, and the bar-shaped boss comprises the detection matching portion and the lever matching portion.

16. An electronic device, comprising the card tray and card holder apparatus according to claim 1.

\* \* \* \* \*